(12) United States Patent
Lin et al.

(10) Patent No.: US 7,701,194 B2
(45) Date of Patent: Apr. 20, 2010

(54) METHODS AND SYSTEM FOR DETECTING DC OUTPUT LEVELS IN AN AUDIO SYSTEM

(75) Inventors: Cheng Hsun Lin, Plano, TX (US); Qiong M. Li, Allen, TX (US); Eric Labbe, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 11/831,237

(22) Filed: Jul. 31, 2007

(65) Prior Publication Data

US 2008/0054950 A1 Mar. 6, 2008

Related U.S. Application Data

(60) Provisional application No. 60/824,250, filed on Aug. 31, 2006.

(51) Int. Cl.
*G01R 23/00* (2006.01)
(52) U.S. Cl. .................................................. 324/76.19
(58) Field of Classification Search ............... 324/76.19
See application file for complete search history.

(56) References Cited

U.S. PATENT DOCUMENTS

| | | | |
|---|---|---|---|
| 5,399,911 A | 3/1995 | Tarricone et al. | |
| 6,577,737 B1 | 6/2003 | Krochmal et al. | |
| 6,975,848 B2 | 12/2005 | Rawlins et al. | |
| 7,072,427 B2 | 7/2006 | Rawlins et al. | |
| 7,453,387 B2 * | 11/2008 | Lee | 341/152 |
| 2002/0121911 A1 * | 9/2002 | Yang et al. | 324/754 |
| 2003/0128776 A1 * | 7/2003 | Rawlins et al. | 375/319 |
| 2003/0214354 A1 * | 11/2003 | Chen et al. | 330/124 D |
| 2004/0252547 A1 * | 12/2004 | Wang | 365/154 |
| 2005/0083116 A1 * | 4/2005 | Risbo et al. | 330/10 |
| 2007/0058711 A1 | 3/2007 | Risbo | |
| 2008/0079407 A1 * | 4/2008 | Shimada et al. | 323/283 |

* cited by examiner

*Primary Examiner*—Timothy J Dole
*Assistant Examiner*—Jeff Natalini
(74) *Attorney, Agent, or Firm*—John J. Patti; Wade J. Brady, III; Frederick J. Telecky, Jr.

(57) ABSTRACT

A system for detecting a direct current (DC) component of a pulse-width modulated (PWM) signal includes a modulator configured to provide at least one PWM signal to an input of an amplifier. A DC detector is configured to detect a DC component of a selected one of the at least one PWM signal as a function of a switching frequency of the selected PWM signal. The DC detector provides at least one report signal that indicates a level of the DC component of the selected PWM signal relative to a predetermined threshold.

18 Claims, 4 Drawing Sheets

METHODS AND SYSTEM FOR DETECTING DC OUTPUT LEVELS IN AN AUDIO SYSTEM

CROSS-REFERENCE TO RELATED APPLICATIONS

This application claims the benefit of U.S. Provisional Patent Application No. 60/824,250, which was filed on Aug. 31, 2006, and entitled NOVEL METHODS FOR DETECTION OF DC OUTPUT LEVELS FROM CLASS D AUDIO AMPLIFIER, the entire contents of which is incorporated herein by reference.

TECHNICAL FIELD

This invention relates to audio systems, and more specifically, to systems and methods for detecting a DC component of a pulse-width modulated signal.

BACKGROUND

Digital techniques for audio signal processing extend to the driving of audio output amplifiers. A popular class of amplifier circuits in many audio applications are "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. CMOS drivers conduct extremely low DC current, and their resulting efficiency is especially beneficial in portable and automotive audio applications. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

As is known in the art, an undesirable effect of a direct current (DC) component can exist in the output of a class D amplifier. The DC component can cause audible artifacts, such as a "click/pop" noise, an audible "humming" noise or a crunching sound. Detection of such an undesirable DC component is thusly needed.

SUMMARY

One aspect of the invention relates to a system for detecting a direct current (DC) component of a pulse-width modulated (PWM) signal. The system includes a modulator configured to provide at least one PWM signal to an input of an amplifier. A DC detector is configured to detect a DC component of a selected one of the at least one PWM signal as a function of a switching frequency of the selected PWM signal. The DC detector provides at least one report signal that indicates a level of the DC component of the selected PWM signal relative to a predetermined threshold.

Another aspect of the invention is related to a system for detecting a DC component of a PWM signal. The system comprises means for providing a plurality of PWM signals. The system also comprises means for amplifying the PWM signals. The system further comprises means for detecting a DC component of a given PWM signal of the plurality of PWM signals based on a switching frequency of the given PWM signal. The system still further comprises means for controlling the means for providing the plurality of PWM signals based on the detected DC component of the given PWM signal.

Yet another aspect of the invention is related to a method for detecting a DC component of a PWM signal. The method includes monitoring a plurality of PWM signals, each of the plurality of PWM signals being associated with a respective one of a plurality of channels. One of the PWM signals is selected. The method also includes determining if a DC component in the selected one of the PWM signals exceeds a predetermined threshold based on a switching frequency of the selected one of the PWM signals. The results of the determination are stored.

DETAILED DESCRIPTION

Figure 1:
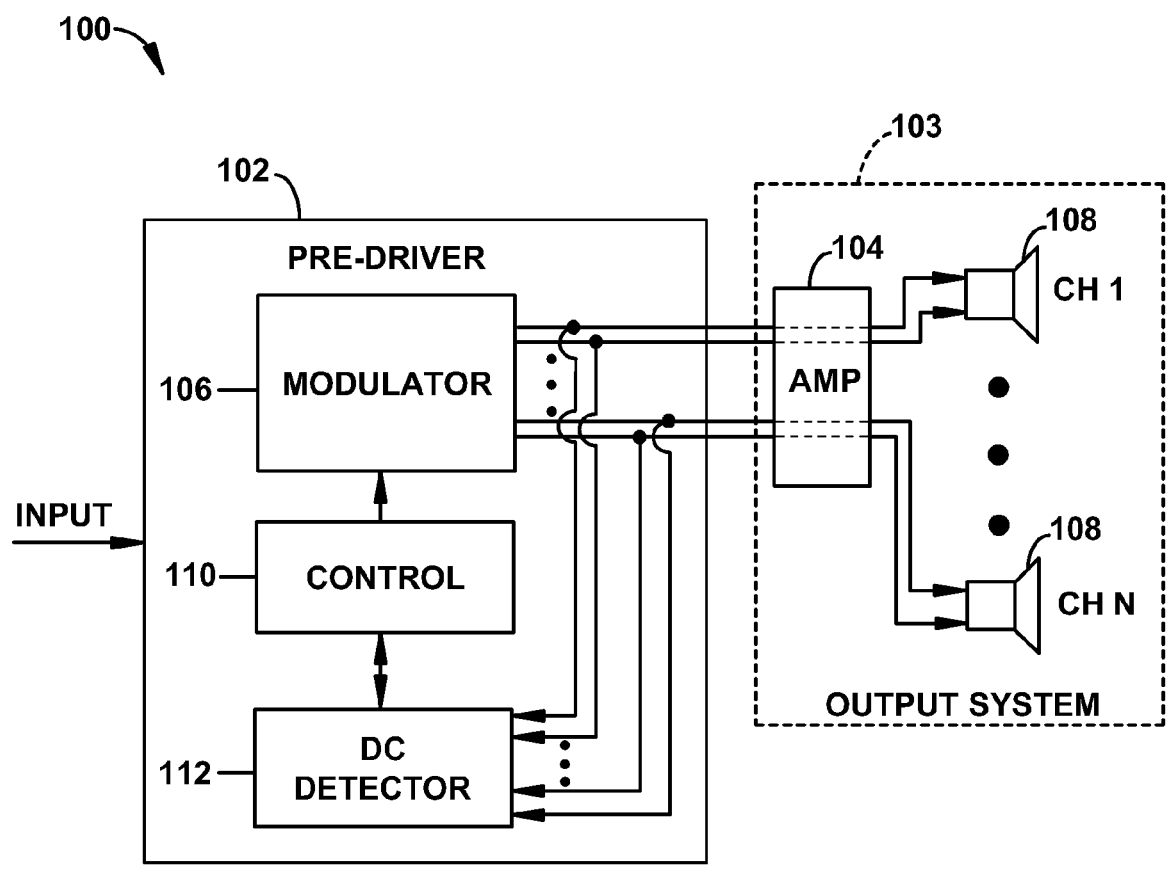
FIG. 1 illustrates an example of a multi-channel system in accordance with an aspect of the invention.

FIG. 1 illustrates an example of a multi-channel system 100 in accordance with an aspect of the invention. The system 100 could be implemented, for example, as a multi-channel audio system (e.g., a stereo system, a surround sound system, etc.). The system 100 includes a pre-driver 102 communicatively coupled to an output system 103. The pre-driver 102 could be implemented, for example, as hardware, software, or a combination thereof. As an example, the pre-driver 102 could be implemented as a digital signal processor or a microcontroller. The pre-driver 102 can include a modulator 106 that can provide PWM signals for N number of channels, where N is an integer greater than or equal to one. Each PWM signal can be implemented as a pair of complementary PWM signals, namely a PWM high side signal, and a PWM low side signal, wherein the PWM high side signal is the complement of the corresponding PWM low side signal. Each pair of PWM signals can be provided to the output system 103. As an example, the output system 103 could be implemented as including an amplifier 104 and loudspeakers 108. In such an example, each pair of complementary PWM signals can be provided to the amplifier 104. The amplifier 104 can receive the plurality of PWM signals and drive loudspeakers 108.

For purposes of simplification of explanation, in the present example, dashed lines are indicated in the amplifier 104 to designate a correspondence between input signals and output signals of the amplifier 104. Additionally, in the present example, each channel is illustrated as including one loudspeaker 108; however, one skilled in the art will appreciate that each channel can include more than one loudspeaker 108. The amplifier 104 can amplify each pair of complementary PWM signals by, for example, providing a programmable amount of gain to each pair of complementary PWM signals. It is to be understood that each pair of complementary PWM signals can be amplified by a specific gain associated with each channel. Additionally, the amplifier 104 can also include a filter, such as a low pass filter, for each output channel that converts the PWM signal into an audio signal.

The pre-driver 102 can receive an INPUT signal, which can be analog or digital. For example, the INPUT signal can be an audio signal. The pre-driver 102 can also include a control 110 that is coupled to the modulator 106 and a direct current (DC) detector 112. The control 110 can control operation of the modulator 106 by causing the modulator 106 to provide a PWM version of the INPUT signal for each of the channels. Additionally, the control 110 can cause the modulator 106 to disable an output for one or more output channels. The control 110 can also provide control signals to the DC detector 112.

Each complementary pair of PWM signals from the modulator 106 can also be provided to the DC detector 112. The DC detector 112 can detect a DC component in at least one signal of each of the pairs of complementary PWM signals. The DC detector 112 provides the control 110 with a report signal that indicates if any of the pairs of complementary PWM signals include a DC component that is above a predetermined threshold. If the report signal indicates that one or more of the pairs of complementary PWM signals have a DC component that is above the predetermined threshold, the control 110 can cause the modulator 106 to disable the corresponding channel or channels. Additionally or alternatively, the control 110 could provide an output signal that causes a human observable output, such as a light emitting diode (LED), or other type of indicator to be activated.

To detect a DC component of each of the pairs of complementary PWM signals, the DC detector 112 can receive or (monitor) the pairs of complementary PWM signals and sequentially select one of the pairs of complementary PWM signals, e.g., a "selected channel." The DC detector 112 can be configured to provide a converted output signal that can be substantially similar to a high side signal of the selected channel (e.g., having substantially same switching frequency as the high side (or low side) signal). The converted output signal thus can be isolated from the PWM signals provided by the modulator 106. The DC detector can employ the converted output to generate a count value that corresponds to a count of the number of pulses (hereinafter "number of highs") and the number of times that the converted output returns to a neutral (hereinafter "number of lows") in a predetermined period, such as about 1 second. The count can be based, for example, on a clock signal with a switching frequency substantially equal to the switching frequency of the selected pair of complementary PWM signals. If the counted number of highs exceeds a predetermined first threshold, and/or if the number of lows is less than a second threshold, the DC detector 112 can provide the report signal to the control 110 that can indicate that the selected channel has a DC component that exceeds predefined limits. In response, the control 110 can perform one or more circuit protection operations in accordance with the manner described herein.

Figure 2:
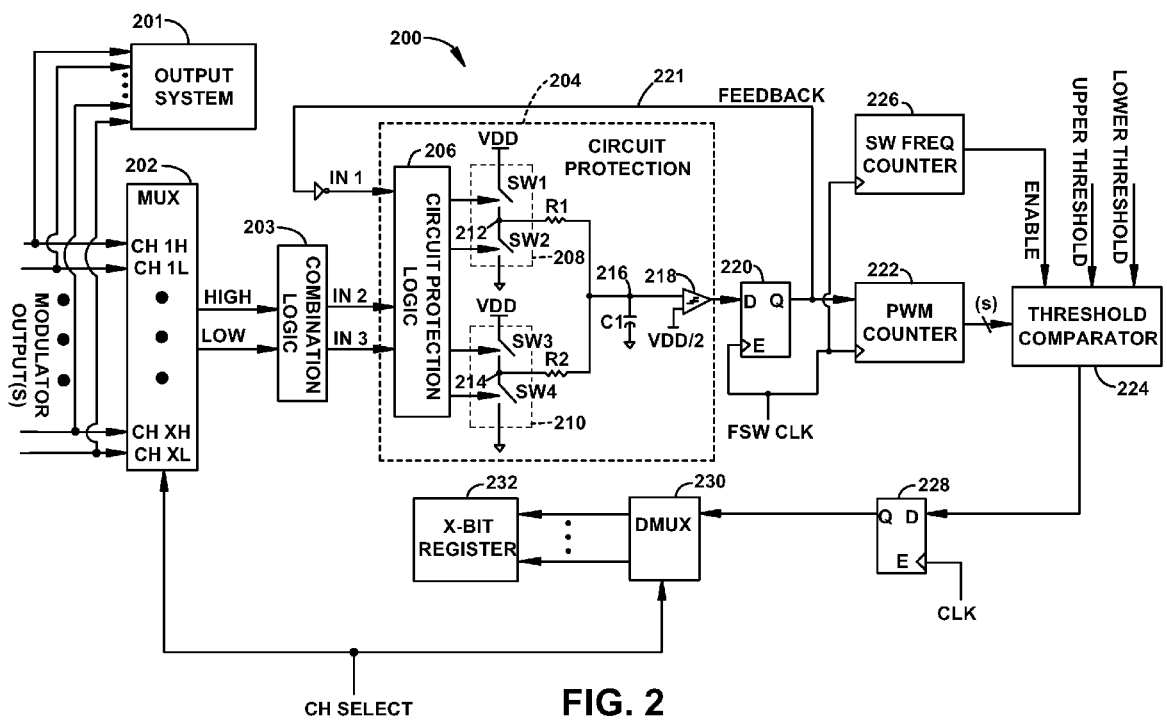
FIG. 2 illustrates an example of a DC detector in accordance with an aspect of the invention.

FIG. 2 illustrates an example of a DC detector 200, in accordance with an aspect of the invention. The DC detector 200 can receive X pairs of PWM signals, wherein X is an integer greater than or equal to one. The PWM signals can be provided, for example, by a modulator circuit or driver circuitry. In one example, each of the X pairs of PWM signals can correspond to a PWM signal that can be provided to an output system 201, such as to drive one or more loudspeakers. Each pair of PWM signals can include a high side signal (e.g., CH 1H) and a low side signal (e.g., CH 1L). The high side signal and the low side signal can be complements of each other. In the present example, a channel select signal (CH SELECT) controls the output of a multiplexer 202. As one example, the CH SELECT can cause the multiplexer 202 to output a selected pair of PWM signals that correspond to one channel. The multiplexer 202 can use the CH select signal to provide means for selecting a PWM signal from a plurality of PWM signals.

The selected pair of PWM signals can be provided to a combinational logic circuit 203 by the multiplexer 202. The combinational logic 203 can be implemented to make adjustments to the selected pair of PWM signals based on voltage and/or phase mismatches between high and low side signals of the selected pair of PWM signals. As one example, the combinational logic 203 can be implemented with two inputs and two outputs. TABLE 1 summarizes a possible configuration for the combinational logic 203. One skilled it the art, however, will appreciate the various other ways that the combinational logic 203 could be implemented.

TABLE 1

| INPUTS | | OUTPUTS | |
|---|---|---|---|
| HIGH | LOW | IN 2 | IN 3 |
| 1 | 0 | 1 | 0 |
| 0 | 1 | 0 | 1 |
| 1 | 1 | 0 | 0 |
| 0 | 0 | 0 | 0 |

If the combinational logic 203 were configured to operate in the manner shown in TABLE 1, a first output signal (IN 2) could be provided to an input of a circuit protection system 204. Additionally a second output signal (IN 3) could be provided to another input of the circuit protection system 204.

The circuit protection system 204 can be configured to provide a converted output that is substantially similar to the high side signal of the selected pair. Additionally, the circuit protection system 204 can be configured to provide a regulation function that adjusts the converted output based on phase and/or voltage mismatches between the high side signal and the low side signal of the selected channel. The circuit protection system 204 can provide means for protecting an audio system from transient signals by disabling the DC detector 200 in response to detecting at least one of a voltage and a phase mismatch between the high side signal and the low side signal of the selected pair of PWM signals. The circuit protection system 204 can also prevent short circuits (e.g., "sneaky paths") such as may be caused by transient signals and/or malfunctioning components.

The circuit protection system 204 includes circuit protection logic 206 that controls a first switching network 208 and a second switching network 210. As one example, the first switching network 208 can include a first and second switch indicated as SW1 and SW2. Additionally, the second switching network 210 can include a third and fourth switch indicated as SW3 and SW4. The switches SW1, SW2, SW3 and SW4 could be implemented, for example, as transistors. The circuit protection logic 206 can, for example, control a state of the switches SW1, SW2, SW3 and SW4. SW1 of the first switching network 208 can be tied to a first voltage of VDD. VDD could be a voltage of about 5 volts (V). SW2 of the first switching network 208 can be tied to a second voltage that is lower than VDD, such as ground. Additionally, SW1 and SW2 of the first switching network 208 can share a node, referred to as a first middle node 212. The first middle node 212 of the first switching network 208 can be connected to a resistor R1. As one example, resistor R1 can be implemented with a resistance of about 400 kilo-ohms (kΩ). R1 can be coupled to a first node 216 of a level detector 218.

The second switching network 210 can be configured in a manner similar to the first switching network 208 such that SW3 of the second switching network 208 can be tied to the first voltage, while SW4 of the second switching network 208 can be tied to the second voltage. Additionally, SW3 and SW4 of the second switching network 208 can share a node, referred to as a second middle node 214. Moreover, the second middle node 214 can be connected to a resistor R2 that could be implemented with a resistance substantially equal to the resistance of R1 (e.g., about 400 kΩ) or a value otherwise having a predetermined functional relationship (or ratio) relative to R1. R2 could also be coupled to the first node 216 of the level detector 218.

A capacitor C1 can also be coupled to the first node 216 of the level detector 218 to reduce or eliminate small voltage variations. As an example, the capacitor C1 can have a capacitance of about 20 picofarads (pF). A second node of the level detector 218 can be connected, for example, to a voltage source that provides about half the voltage of VDD, indicated as VDD/2. The level detector 218 can provide the converted output signal to a delay device. The level detector 218 can provide a high converted output signal (e.g., logic level 1), when the input signal at the first node 216 of the level detector 218 is above VDD/2, until the input signal at the first node 216 falls below VDD/2, at which point, the level detector 218 can provide a low converted output signal (e.g. logic level 0). In the present example, the delay device can be implemented as a first D-flip flop 220. The converted output of the of the circuit protection system 204 can be provided to a data input of the first D-flip flop 220. Additionally, a switching frequency clock signal (FSW CLK) can be provided to the D-flip flop at an enable input.

As one example the circuit protection logic 206 can be configured with three inputs and four outputs, wherein each output controls a switch. TABLE 2 summarizes a possible configuration for the circuit protection logic 206. One skilled it the art, however, will appreciate the various other ways that the circuit protection logic 206 could be implemented.

TABLE 2

| INPUTS | | | OUTPUTS | | | |
|---|---|---|---|---|---|---|
| IN 1 | IN 2 | IN 3 | SW 1 | SW 2 | SW 3 | SW 4 |
| 0 | 0 | 0 | OPEN | CLOSED | OPEN | OPEN |
| 0 | 0 | 1 | OPEN | OPEN | OPEN | CLOSED |
| 1 | 0 | 0 | CLOSED | OPEN | OPEN | OPEN |
| 1 | 1 | 0 | CLOSE | OPEN | CLOSED | OPEN |
| 0 | 1 | 0 | OPEN | OPEN | OPEN | OPEN |
| 0 | 1 | 0 | OPEN | OPEN | OPEN | OPEN |

If the circuit protection logic 206 were configured to operate in the manner shown in TABLE 2, the IN 2 signal of the combinational logic 203 can correspond to the second input of circuit protection logic 206. Additionally, the IN 3 output signal of combinational logic 203 can correspond to the third input of the circuit protection logic 206. The first input (IN 1) can correspond to a feedback signal 221, wherein the feedback signal 221 can be inverted (discussed below).

The output of the first D-flip flop 220 can be provided to a PWM counter (PWM COUNTER) 222. Additionally, an output of the first D-flip flop 220 can be provided as the feedback signal 221, which can be inverted and provided to the circuit protection logic 206 (e.g., IN 1 signal). The PWM counter 222 can also be clocked by the FSW CLK. The PWM counter 222 counts number of highs and lows provided by the output of the first D-flip flop 220 during a specific period of time, such as 1 second. The number of highs and lows counted can be referred to as count values. The PWM counter 222 can provide the count values (via one or more data signals) to a threshold comparator 224. The FSW CLK can also be inputted into a switching frequency counter 226. The switching frequency counter 226 can be implemented to provide an enable signal to the threshold comparator 224 when the FSW CLK has cycled the specific period of time (e.g., about 1 second).

A controller or clock generator provides the FSW CLK signal to the first D-flip flop 220. The FSW CLK can be implemented as a clock signal that is synchronized with a digital clock, namely signal CLK. The FSW CLK can be provided at a frequency substantially equal to a switching frequency of the PWM signal provided to the multiplexer 202 that corresponds to the selected pair. As an example, the FSW CLK can be provided with a frequency of about 357 kilohertz (kHz), 417 kHz, 500 kHz or other desired frequency. The CLK signal, to which the FSW CLK can be synchronized, can be provided with a substantially higher frequency, such as on the order of about 10 times greater (e.g., 5 megahertz (MHz)).

The threshold comparator 224 compares the count values to an upper threshold value and to a lower threshold value. The upper threshold value and the lower threshold value can be provided, for example, by the controller, or one or more data registers. If the number of highs exceeds the upper threshold value, and/or if the number of lows is below the lower threshold value, the threshold comparator 224 can be configured to provide a high comparison value (e.g., a logic level 1) to a data input of a second D-flip flop 228. Conversely if, the number of highs does not exceed the upper threshold, and the number of lows is not below the lower threshold, the threshold comparator 224 can provide a low comparison value (e.g., logic level 0) to the data input of the second D-flip flop 228. The second D-flip flop 228 can be clocked by the CLK signal. The output of the second D-flip flop 228 can be provided to a demultiplexer 230. The demultiplexer 230 can be controlled by the CH SELECT. The demultiplexer 230 can have X number of outputs. Each of the X outputs can be provided to an X-bit register 232. Each of the X-bits can correspond to a selected pair. The X-bit register 232 can be implemented as report data that can be read by other devices, such as the controller. The threshold comparator 224 can be implemented as an analog comparator (e.g., including an op-amp), a logic circuit or as function implemented by a processor). The X-bit register 232 and/or the threshold comparator 224 can thus provide means for reporting means for detecting a DC component of a PWM signal to a means for controlling a means for providing a plurality of PWM signals.

In the present example, the CH SELECT causes the multiplexer 202 to sequentially select a channel among the plurality of channels inputted, causing the multiplexer 202 to provide a selected pair of PWM signals. The sequential selection of the PWM signals can be implemented in a predetermined or random order. Additionally, the CH SELECT can cause the demultiplexer 230 to select sequentially an output among a plurality of outputs, causing the demultiplexer 230 to provide a signal to a selected bit of the X-bit register 232. In one example, the CH SELECT can cause the multiplexer 202 and the demultiplexer 230 to be substantially synchronized, such that the multiplexer 202 and demultiplexer 230 can establish and maintain a one-to-one correspondence between selected pairs, and selected bits. For instance, the CH SELECT can cause the multiplexer 202 and the demultiplexer 230 to change the selected channel and the selected output, respectively at a predetermined interval so that report data can be generated and stored for each of the channels. The predetermined interval can be referred to as a "counting time." One skilled in the art will appreciate that the counting time can be any amount of time, such as about 1 second.

The selected channel, which can include a high side and low side signal, can be provided the circuit protection system 204. The circuit protection system 204 can perform a regulation function that can provide the converted output, as discussed above. The converted output can be delayed and provided to the PWM counter 222. The PWM counter 222 counts the number of highs and lows in the delayed converted output and provides the count value to the threshold comparator 224. The threshold comparator 224 is triggered by the switching frequency counter 226 to provide an output to the second D-flip flop 228. The second D-flip-flop 228 delays the compared signal and provides it to the demultiplexer 230, which writes the delayed comparison signal to the selected bit in the X-bit register 232. The same process can be repeated for continuously (or intermittently) for the other channels according to an order or sequence defined by the CH SELECT.

Figure 3:
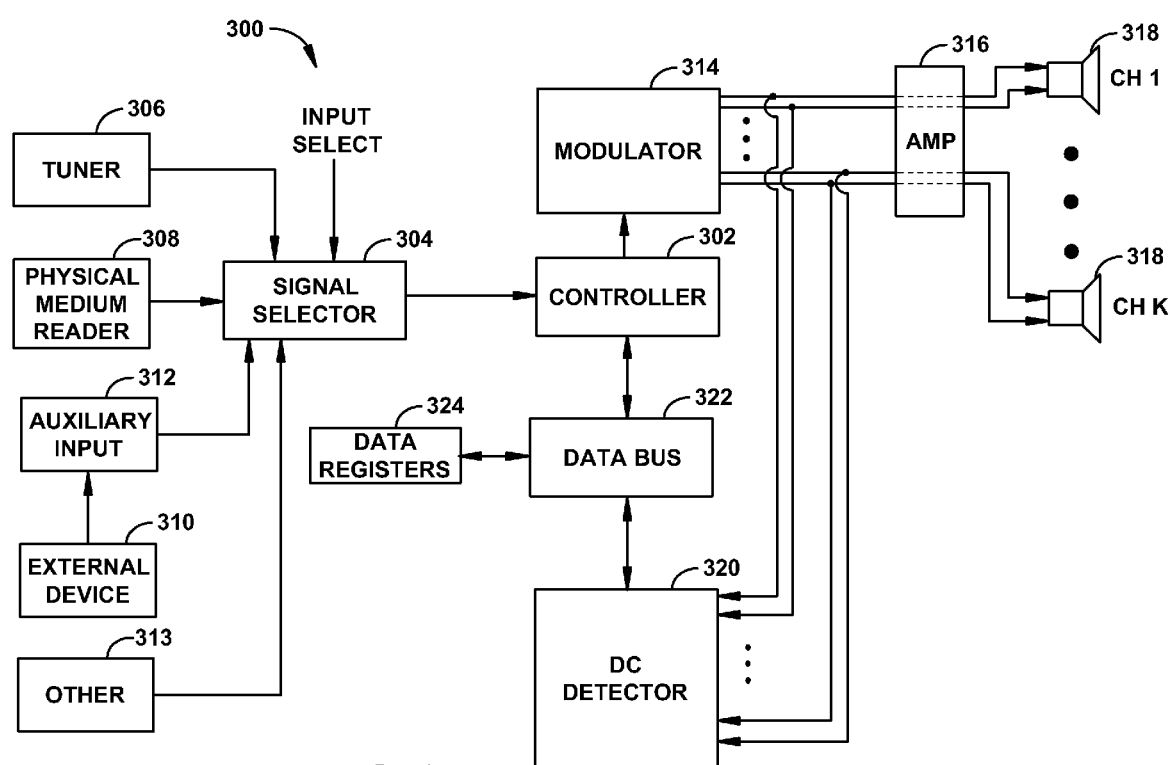
FIG. 3 illustrates an example of a multi-channel audio system in accordance with an aspect of the invention.

FIG. 3 illustrates an example of a multi-channel audio system 300 in accordance with an aspect of the invention. The system 300 includes a controller 302 that receives an input signal from a signal selector 304. The controller 302 can be implemented, for example, as hardware, software, or a combination thereof, such as a microcontroller, a digital signal processor, or the like. The signal selector 304 could be implemented, for example, as a multiplexer, a multiple pole switch, etc. The signal selector 304 can receive an audio signal from a plurality of sources. In the present example, the audio signal could be provided, by a tuner 306 (such as an antenna tuner), a physical medium reader 308 (e.g., a Compact Disc player or taper player), an external device 310, such as a Moving Picture Experts Group Audio Level 3 (MP3) player coupled to an auxiliary input port 312 or another device 313. One skilled in the art will appreciate the various devices that could be used to implement the another device 313. The signal selector 304 could be controlled, for example, by an INPUT SELECT signal that causes the signal selector 304 to select one of the plurality of sources and provide the corresponding audio signal.

The system 300 includes a modulator 314 communicatively coupled to an amplifier 316 that can provide PWM signals for K number of audio channels, where K is an integer greater than or equal to one. The modulator 314 could be implemented, for example, as hardware, software, a combination of hardware and software or other means for providing the K PWM signals. In the present example, each channel is illustrated as including one loudspeaker 318; however, one skilled in the art will appreciate that each channel can include more than one loudspeaker 318. Each PWM signal can be implemented as a pair of complementary PWM signals, namely a PWM high side signal, and a PWM low side signal, wherein the PWM high side signal is the complement of the corresponding PWM low side signal. The amplifier 316 can, for example, receive the plurality of PWM signals and drive a plurality of loudspeakers 318.

For purposes of simplification of explanation, in the present example, dashed lines are indicated in the amplifier 316 to designate a correspondence between input signals and output signals of the amplifier 316. The amplifier 316 can amplify each pair of complementary PWM signals by, for example, providing a programmable amount of gain to each pair of complementary PWM signals. It is to be understood that each pair of complementary PWM signals can be amplified by a gain, which may vary for each channel. Additionally, the amplifier 316 can also include a filter, such as a low pass filter, for each output channel that converts the PWM signal into an audio signal. Accordingly, the amplifier 316 can provide means for amplifying a PWM signal and for driving a plurality of loudspeakers 318.

The controller 302 can process and manipulate the input signal. As an example, the controller 302 can be configured to separate the input signal into two or more independent audio signals, such as in a stereo system or a surround sound system. Thus, the controller 302 can provide the modulator 314 with one or more channel signals that cause an audio signal to be played on a particular audio channel. Additionally, the controller 302 can cause the modulator 314 to disable an output for one or more output channels.

The controller 302 can also be communicatively coupled to a DC detector 320 via a data bus 322 (see e.g., FIG. 2). The data bus 322 could be implemented, for example, as an I²C data bus 322. Additionally, the controller 302 and the DC detector 320 can communicate with data registers 324 via the data bus 322. The data registers 324 could be implemented, for example, as random access memory (RAM), static or dynamic. The controller 302 can, for example, provide a control signal to the DC detector 320. Additionally, each complementary pair of PWM signals from the modulator 314 can also be provided to the DC detector 320.

The DC detector 320 can detect a DC component in each of the pairs of complementary PWM signals, such as based on the switching frequency of each selected signal. The DC detector 320 can provide report data that can be stored in least one data register. The report data can indicate if one or more of the pairs of PWM output signals have a DC component that exceeds a predetermined threshold. The controller 302 can read the report data from the data registers 324, such as can be used for controlling operation of the modulator 314. If the report data indicates that one or more of the pairs of complementary PWM signals have a DC component that is above the predetermined threshold, the controller 302 can cause the modulator 314 to disable the corresponding channel or channels. Additionally or alternatively, the controller 302 could provide an output signal that causes a human observable output, such as an LED or other indicator to be activated. Additionally or alternatively, the controller 302 can be configured such that the controller 302 ignores a first indication (in the report data) that one of the pairs of complementary PWM signals has a DC component that is above the predetermined threshold. The ignoring of the first report can be implemented to prevent a premature diagnosis caused, for example, by transient signals, and/or timing errors during a startup and/or reset sequence of the system 300.

To detect a DC component of each of the pairs of complementary PWM signals, the DC detector 320 can pass a selected pair of complementary PWM signals. For instance, a multiplexer can be implemented such that the DC detector 320 selects a particular channel, and the output of the multiplexer is the corresponding pair of complementary PWM signals associated with the selected channel.

The DC detector 320 can be configured to control the multiplexer such as to intermittently or continuously, sequentially select from the pairs of complementary PWM signals received by the DC detector 320 for a particular channel. The DC detector 320 can be configured to provide a converted output signal that can be substantially similar to a high side signal of the selected channel. The converted output can be employed to ascertain a count value that corresponds to a count of the number of highs and the number of lows in a predetermined period, such as about 1 second. The count value can be based, for example, on a clock signal with a switching frequency substantially equal to the switching frequency of the selected pair of complementary PWM signals.

Accordingly, the DC detector 320 can provide means for detecting a DC component of a PWM signal based on the switching frequency of the PWM signal. If the number of highs exceeds a predetermined upper threshold, and/or if the number of lows is less than a lower threshold, the DC detector 320 can write report data to the data registers 324 that can indicate that the selected channel has a DC component that exceeds predefined limits. The controller 302 can read the report data from the data registers 324, and can perform operations in accordance with the manner described above. The controller 302 can thus provide means for controlling the modulator 314 based on means for detecting a DC component of the PWM signal.

Figure 4:
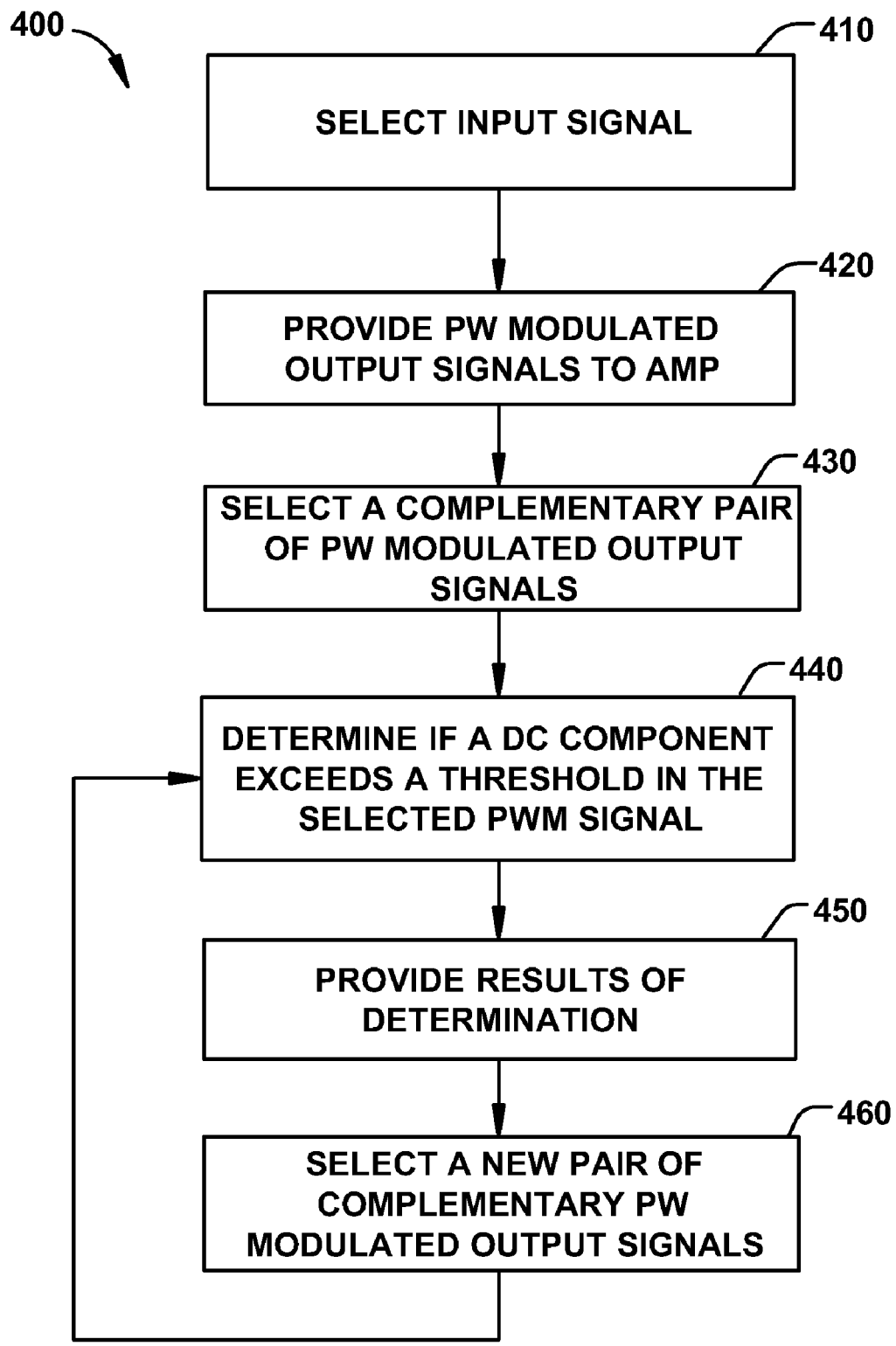
FIG. 4 illustrates an example of a flow chart depicting a process in accordance with an aspect of the invention.

FIG. 4 illustrates a flow chart of a process 400 in accordance with an aspect of the invention. It is to be understood and appreciated that the illustrated actions, in other embodiments, may occur in different orders and/or concurrently with other actions. Moreover, not all illustrated features may be required to implement a process. The process 400 could be implemented to detect a DC component in an audio system with a plurality of loudspeakers, wherein each loudspeaker can be coupled to an output channel. It is to be appreciated that the process 400 can also be utilized to detect a DC component in PWM output in other types of circuitry.

At 410, an input signal is selected from a plurality of input sources. The input sources could be, for example, a CD player, a cassette tape player, an antenna tuner, an auxiliary input, etc. The selected input signal can be implemented as an audio signal. The selected input signal can be provided to a modulator. The modulator can be implemented as hardware, software or a combination thereof. The process proceeds to 420. At 420, the modulator provides a plurality of PWM signals to an amplifier based on the input signal. The modulator can, for example, provide two complementary PWM signals to the amplifier for each of the plurality of loudspeakers. The amplifier can regulate and amplify the PWM signals and provide signals to drive the plurality of loudspeakers, such as analog audio signals. The process proceeds to 430.

At 430, one of the complementary pairs of PWM output signals is selected. For instance, the selected PWM output signal can be selected by a DC detector or other associated circuitry. The process proceeds to 440. At 440, the DC detector determines if a DC component of at least one of the selected pair of signals is above a predetermined threshold. The determination can be made based on a switching frequency of the selected pair of PWM signals.

At 450, results of the determination can be provided by the DC detector. The results could be stored, for example, by writing a value to a specific memory location of a data register. The results could be used by a controller to take appropriate action based on the recorded results. As an example, the controller can disable PWM signal for a loudspeaker associated with the channel being driven by the selected pair of signals. In another example, the controller can actuate a visual indicator (e.g., an LED) that indicates that a DC component level of a particular loudspeaker. The process proceeds to 460. At 460, a new pair of complementary PWM signals can be selected by the DC detector. The process returns to 440.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such applications including alterations, modifications and variations that fall within the scope of this application, including the appended claims.

What is claimed is:

1. A system for detecting a direct current (DC) component of a pulse-width modulated (PWM) signal, the system comprising:
   a modulator that generates the PWM signal; and
   a DC detector that detects a DC component of the PWM signal as a function of a switching frequency of the PWM signal, wherein the DC detector includes:
      a counter that provides a first count value and a second count value, wherein the first count value characterizes the number of times that the PWM signal transitions from a first voltage to a second voltage in a predetermined amount of time, and wherein the second count value characterizes the number of times that the PWM signal transitions from the second voltage to the first voltage in the predetermined amount of time; and
      a threshold comparator that compares the first count value to a first threshold and compares the second count value to a second threshold to provide a report signal that indicates a level of the DC component of the PWM signal relative to at least one of the first and second thresholds.

2. The system of claim 1, wherein the PWM signal further comprises a plurality of PWM signals, and wherein the DC detector further comprises a selector that selects sequentially between detecting the DC component for each of the plurality of PWM signals based on a channel selection signal.

3. The system of claim 2, wherein the system further comprises a controller that controls the modulator based on an input signal and the report signal.

4. The system of claim 3, wherein the report signal further comprises a plurality of report signals, and wherein the controller is configured to ignore a first one of the plurality report signals associated with a selected one of the PWM signals that indicates that the DC component for the selected one of the PWM signals is above the second threshold.

5. The system of claim 3, wherein the controller provides the channel selection signal to the selector that causes the selector to select the selected one of the plurality of PWM signals and synchronizes one of the report signals with the selected one of the plurality of PWM signals.

6. The system of claim 5, wherein the DC detector further comprises:
   a register that includes a block of data for each of the plurality of PWM signals; and
   a demultiplexer controlled by the channel selection signal that causes data to be stored in the register.

7. The system of claim 1, wherein the first voltage is lower than the second voltage.

8. The system of claim 1, wherein the counter is controlled with a switching frequency clock signal having a frequency that is substantially equal to the switching frequency of the PWM signal.

9. The system of claim 8, wherein the switching frequency clock signal is synchronized with a digital clock signal having a frequency that is at least 5 times greater than the frequency of the switching frequency clock signal.

10. The system of claim 1, wherein the system further comprising a controller configured to disable at least a portion of the modulator based at least in part on the report signal.

11. The system of claim 1, wherein the DC detector further comprises a circuit protection system that protects the DC detector from transient signals caused by at least one of a phase shift and a voltage mismatch between a high side signal and a low side signal of the PWM signal.

12. The system of claim 11, wherein the circuit protection system further comprises circuit protection logic that disables the DC detector by opening at least one switch in response to detecting the at least one of the phase shift and the voltage mismatch between the high side signal and the low side signal of the PWM signal.

13. A method comprising:

receiving a PWM signal by a DC detector;

determining a first count value and a second count value, wherein the first count value characterizes the number of times that the PWM signal transitions from a first voltage to a second voltage in a predetermined amount of time, and wherein the second count value characterizes the number of times that the PWM signal transitions from the second voltage to the first voltage in the predetermined amount of time; and comparing each of the first count value and the second count value to a first threshold and a second threshold, respectively, to provide a report signal that indicates a level of a DC component of the PWM signal relative to at least one of the first and second thresholds.

14. The method of claim 13, wherein the method further comprises the step of disabling the ability to provide the PWM signal if the report signal indicates that the DC component of the PWM signal is above the second threshold.

15. A DC detector comprising:

logic that is adapted to receive a plurality of PWM signals;

a protection circuit that is coupled to the logic protects the DC detector from transient signals caused by at least one of a phase shift and a voltage mismatch;

a delay element that is coupled to the protection circuit and that is clocked by a clock signal;

a frequency counter that receives the clock signal and generates an enable signal;

a PWM counter that is coupled to the delay element and that is clocked by the clock signal, wherein a first count value characterizes the number of times that a PWM signal transitions from a first voltage to a second voltage in a predetermined amount of time, and wherein a second count value characterizes the number of times that the PWM signal transitions from the second voltage to the first voltage in the predetermined amount of time; and a threshold comparator that is coupled to the frequency counter and the PWM counter, wherein the threshold comparator receives the enable signal from the frequency counter, and wherein the threshold comparator compares output signals from the PWM counter to one of a first threshold and a second threshold to generate a report signal that indicates a level of a DC component of one of the PWM signals relative to one of the first and second threshold signals.

16. The DC detector of claim 15, wherein the logic further comprises:

a multiplexer that receives the plurality of PWM signals; and combinational logic that is coupled to the multiplexer.

17. The DC detector of claim 16, wherein the protection circuit further comprises:

protection logic that is coupled to the combinational logic;

a switch network that is coupled to the protection logic;

an RC network that is coupled to the switch network; and a level detector that is coupled to the RC network.

18. The DC detector of claim 15, wherein the delay element is a D-type flip-flop.

* * * * *